United States Patent
Beaman et al.

(10) Patent No.: US 6,334,247 B1
(45) Date of Patent: *Jan. 1, 2002

(54) HIGH DENSITY INTEGRATED CIRCUIT APPARATUS, TEST PROBE AND METHODS OF USE THEREOF

(75) Inventors: Brian Samuel Beaman, Hyde Park; Keith Edward Fogel, Bardonia; Paul Alfred Lauro, Nanuet; Maurice Heathcote Norcott, Valley Cottage; Da-Yuan Shih, Poughkeepsie; George Frederick Walker, New York, all of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/872,519

(22) Filed: Jun. 11, 1997

Related U.S. Application Data

(62) Division of application No. 08/754,869, filed on Nov. 22, 1996.

(51) Int. Cl.[7] .............................................. H01R 43/00
(52) U.S. Cl. ............................ 29/842; 29/830; 29/843; 174/261; 361/772
(58) Field of Search ........................ 29/827, 850, 846, 29/829, 842, 843, 840; 174/261, 254; 361/772, 776

(56) References Cited

U.S. PATENT DOCUMENTS

| | | | |
|---|---|---|---|
| 3,541,222 A | 11/1970 | H. L. Parks et al. | ....... 514/469 |
| 3,795,037 A | 3/1974 | Luttmer | ....... 29/628 |

(List continued on next page.)

FOREIGN PATENT DOCUMENTS

| | | | | |
|---|---|---|---|---|
| JP | 45-29855 | * | 9/1970 | ............. 29/827 |
| JP | 2-290564 | * | 11/1990 | |
| SU | 1003396 | | 8/1980 | |

OTHER PUBLICATIONS

IBM Tech. Discl. Bull. vol. 15 No. 11 (Apr. 1, 1973) pp 3428–29 by B. Best et al.*

(List continued on next page.)

Primary Examiner—Carl J. Arbes
(74) Attorney, Agent, or Firm—Daniel P. Morris

(57) ABSTRACT

The present invention is directed to a high density test probe which provides a means for testing a high density and high performance integrated circuits in wafer form or as discrete chips. The test probe is formed from a dense array of elongated electrical conductors which are embedded in an compliant or high modulus elastomeric material. A standard packaging substrate, such as a ceramic integrated circuit chip packaging substrate is used to provide a space transformer. Wires are bonded to an array of contact pads on the surface of the space transformer. The space transformer formed from a multilayer integrated circuit chip packaging substrate. The wires are as dense as the contact location array. A mold is disposed surrounding the array of outwardly projecting wires. A liquid elastomer is disposed in the mold to fill the spaces between the wires. The elastomer is cured and the mold is removed, leaving an array of wires disposed in the elastomer and in electrical contact with the space transformer The space transformer can have an array of pins which are on the opposite surface of the space transformer opposite to that on which the elongated conductors are bonded. The pins are inserted into a socket on a second space transformer, such as a printed circuit board to form a probe assembly. Alternatively, an interposer electrical connector can be disposed between the first and second space transformer.

80 Claims, 10 Drawing Sheets

U.S. PATENT DOCUMENTS

| | | | |
|---|---|---|---|
| 3,862,790 A | 1/1975 | Davies et al. | |
| 3,911,361 A | 10/1975 | Bove et al. | 324/158 |
| 3,954,317 A | 5/1976 | Gilissen et al. | |
| 3,963,986 A | 6/1976 | Morton et al. | 324/158 |
| 4,003,621 A | 1/1977 | Lamp | |
| 4,008,300 A | 2/1977 | Ponn | 264/104 |
| 4,038,599 A | 7/1977 | Bove et al. | 324/158 |
| 4,118,092 A | 10/1978 | Sado et al. | |
| 4,203,203 A | 5/1980 | Gilissen et al. | 29/846 |
| 4,221,047 A | 9/1980 | Narken et al. | 29/840 |
| 4,295,700 A | 10/1981 | Sado | |
| 4,355,199 A | 10/1982 | Luc | 174/68.5 |
| 4,400,234 A | 8/1983 | Berg | 156/634 |
| 4,402,562 A | 9/1983 | Sado | |
| 4,408,814 A | 10/1983 | Takashi et al. | |
| 4,509,099 A | 4/1985 | Takamatsu et al. | 361/413 |
| 4,520,562 A | 6/1985 | Sado et al. | 29/878 |
| 4,548,451 A | 10/1985 | Benarr et al. | |
| 4,555,523 A | 11/1985 | Hall et al. | 514/469 |
| 4,575,166 A | 3/1986 | Kasdagly et al. | |
| 4,577,918 A | 3/1986 | Kasdagly | 339/17 |
| 4,585,727 A * | 4/1986 | Ream | |
| 4,622,514 A | 11/1986 | Lewis | 324/158 |
| 4,663,742 A | 5/1987 | Andersen et al. | 365/189 |
| 4,778,950 A | 10/1988 | Lee et al. | 174/356 |
| 4,793,814 A | 12/1988 | Zifcak et al. | 439/66 |
| 4,811,296 A | 3/1989 | Garde | 365/189 |
| 4,816,754 A | 3/1989 | Buechele et al. | 324/158 |
| 4,820,170 A | 4/1989 | Redmond et al. | 439/66 |
| 4,820,376 A | 4/1989 | Lambert et al. | 156/643 |
| 4,832,609 A | 5/1989 | Chung | 439/67 |
| 4,875,614 A | 10/1989 | Cipolla et al. | 228/5.5 |
| 4,955,523 A * | 9/1990 | Carlomagne et al. | |
| 4,998,885 A | 3/1991 | Beaman | 439/66 |
| 5,037,312 A | 8/1991 | Casciotti et al. | 439/66 |
| 5,049,084 A | 9/1991 | Bakke | 439/66 |
| 5,099,309 A | 3/1992 | Kryzaniwsky | 357/75 |
| 5,132,613 A | 7/1992 | Papae et al. | 324/158 |
| 5,148,103 A | 9/1992 | Pasiecznik, Jr. | 324/158 |
| 5,195,237 A * | 3/1993 | Cray et al. | 29/843 X |
| 5,258,236 A | 11/1993 | Arjavalingan et al. | 428/626 |
| 5,371,654 A | 12/1994 | Beaman et al. | 361/744 |
| 5,476,211 A * | 12/1995 | Khandros | |

OTHER PUBLICATIONS

"Shaped Elastomeric Interposer for Large Area Array Connectors", Disclosed Anonymously, Research Disclosure, Apr. 1991, Number 32490, Kenneth Mason Publications, Ltd., England, p. 278.

"Elastomeric Interposer using wires in Elastomer pad with controlled compliance" Disclosed Anonymously, Research Disclosure, Apr. 1991, Number 32492, Kenneth Mason Publications, Ltd., England, p. 279.

"Elastomeric Interposer using film supported metal conductors" Disclosed Anonymously, Research Disclosure, Apr. 1991, Number 32491, Kenneth Mason Publications, Ltd., England, p. 278.

"High Density Area Array Connector" Disclosed Anonymously, Research Disclosure, Apr. 1991, Number 32486, Kenneth Mason Publications, Ltd., England, p. 275.

IBM Technical Disclosure Bullentin vol. 15, No. 11 (Apr. 1973) pp. 3428–3429 by B Best et al.

* cited by examiner

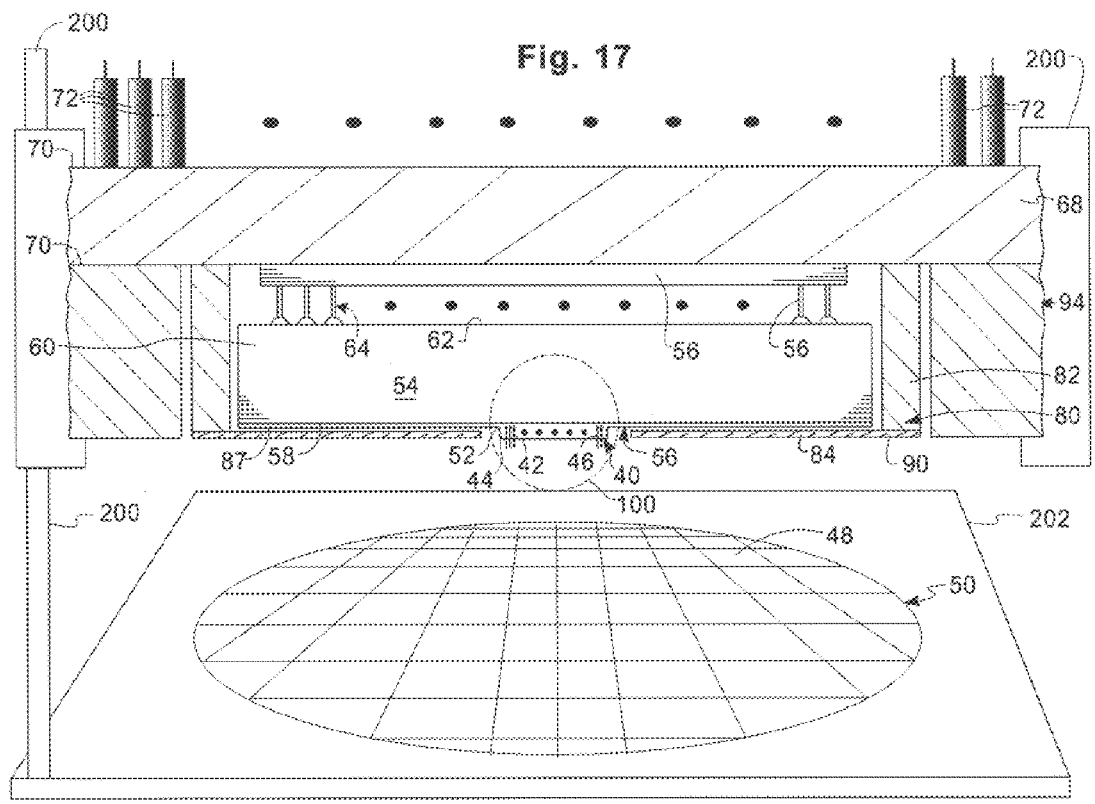

HIGH DENSITY INTEGRATED CIRCUIT APPARATUS, TEST PROBE AND METHODS OF USE THEREOF

This is a division of application Ser. No. 08/754,869, filed Nov. 22, 1996.

FIELD OF THE INVENTION

This invention relates to an apparatus and test probe for integrated circuit devices and methods of use thereof.

BACKGROUND OF THE INVENTION

In the microelectronics industry, before integrated circuit (IC) chips are packaged in an electronic component, such as a computer, they are tested. Testing is essential to determine whether the integrated circuit's electrical characteristics conform to the specifications to which they were designed to ensure that electronic component performs the function for which it was designed.

Testing is an expensive part of the fabrication process of contemporary computing systems. The functionality of every I/O for contemporary integrated circuit must be tested since a failure to achieve the design specification at a single I/O can render an integrated circuit unusable for a specific application. The testing is commonly done both at room temperature and at elevated temperatures to test functionality and at elevated temperatures with forced voltages and currents to burn the chips in and to test the reliability of the integrated circuit to screen out early failures.

Contemporary probes for integrated circuits are expensive to fabricate and are easily damaged. Contemporary test probes are typically fabricated on a support substrate from groups of elongated metal conductors which fan inwardly towards a central location where each conductor has an end which corresponds to a contact location on the integrated circuit chip to be tested. The metal conductors generally cantilever over an aperture in the support substrate. The wires are generally fragile and easily damage and are easily displaceable from the predetermined positions corresponding to the design positions of the contact locations on the integrated circuit being tested. These probes last only a certain number of testing operations, after which they must be replaced by an expensive replacement or reworked to recondition the probes.

FIG. 1 shows a side cross-sectional view of a prior art probe assembly 2 for probing integrated circuit chip 4 which is disposed on surface 6 of support member 8 for integrated circuit chip 4. Probe assembly 2 consists of a dielectric substrate 10 having a central aperture 12 therethrough. On surface 14 of substrate 10 there are disposed a plurality of electrically conducting beams which extend toward edge 18 of aperture 12. Conductors 16 have ends 20 which bend downwardly in a direction generally perpendicular to the plane of surface 14 of substrate 10. Tips 22 of downwardly projecting electrically conducting ends 20 are disposed in electrical contact with contact locations 24 on surface 25 of integrated circuit chip 4. Coaxial cables 26 bring electrical signals, power and ground through electrical connectors 28 at periphery 30 of substrate 10. Structure 2 of FIG. 1 has the disadvantage of being expensive to fabricate and of having fragile inner ends 20 of electrical conductors 16. Ends 20 are easily damaged through use in probing electronic devices. Since the probe 2 is expensive to fabricate, replacement adds a substantial cost to the testing of integrated circuit devices. Conductors 16 were generally made of a high strength metal such as tungsten to resist damage from use. Tungsten has an undesirably high resistivity.

SUMMARY OF THE INVENTION

It is an object of the present invention to provide an improved high density test probe, test apparatus and method of use thereof:

It is another object of the present invention to provide an improved test probe for testing and burning-in integrated circuits.

It is another object of the present invention to provide an improved test probe and apparatus for testing integrated circuits in wafer form and as discrete integrated circuit chips.

It is an additional object of the present invention to provide probes having contacts which can be designed for high performance functional testing and for high temperature burn in applications.

It is yet another object of the present invention to provide probes having contacts which can be reworked several times by resurfacing some of the materials used to fabricate the probe of the present invention.

It is a further object of the present invention to provide an improved test probe having a probe tip member containing a plurality of elongated conductors each ball bonded to electrical contact locations on space transformation substrate.

A broad aspect of the present invention is a test probe having a plurality of electrically conducting elongated members embedded in a material. One end of each conductor is arranged for alignment with contact locations on a workpiece to be tested.

In a more particular aspect of the present invention, the other end of the elongated conductors are electrically connected to contact locations on the surface of a fan-out substrate. The fan-out substrate provides space transformation of the closely spaced electrical contacts on the first side of the fan-out substrate. Contact locations having a larger spacing are on a second side of the fan out substrate.

In yet another more particular aspect of the present invention, pins are electrically connected to the contact locations on the second surface of the fan out substrate.

In another more particular aspect of the present invention, the plurality of pins on the second surface of the fan-out substrate are inserted into a socket on a second fan-out substrate. The first and second space transformation substrates provide fan out from the fine pitch of the integrated circuit I/O to a larger pitch of electrical contacts for providing signal, power and ground to the workpiece to be tested.

In another more particular aspect of the present invention, the pin and socket assembly is replaced by an interposer containing a plurality of elongated electrical connectors embedded in a layer of material which is squeezed between contact locations on the first fan-out substrate and contact locations on the second fan-out substrate.

In another more particular aspect of the present invention, the test probe is part of a test apparatus and test tool.

Another broad aspect of the present invention is a method of fabricating the probe tip of the probe according to the present invention wherein a plurality of elongated conductors are bonded to contact locations on a substrate surface and project away therefrom.

In a more particular aspect of the method according to the present invention, the elongated conductors are wire bonded to contact locations on the substrate surface. The wires project preferably at a nonorthogonal angle from the contact locations.

In another more particular aspect of the method of the present invention, the wires are bonded to the contact locations on the substrate are embedded in a elastomeric material to form a probe tip for the structure of the present invention.

In another more particular aspect of the present invention, the elongated conductors are embedded in an elastomeric material.

BRIEF DESCRIPTION OF THE DRAWINGS

FIG. 17 shows both interposer 76 and probe tip 40 rigidly bonded to space transformer 60.

DETAILED DESCRIPTION

Figure 1:
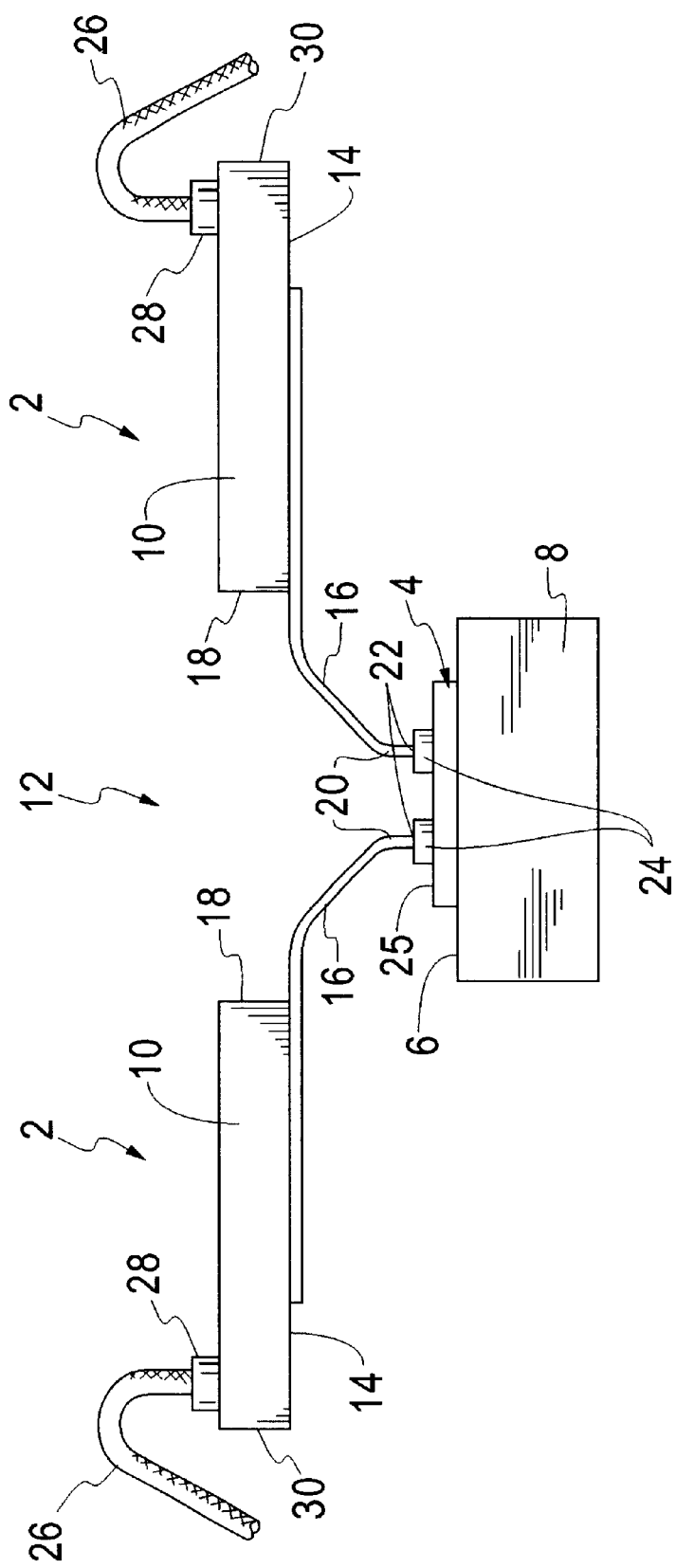
FIG. 1 is a schematic cross-section of a conventional test probe for an integrated circuit device.
Figure 2:
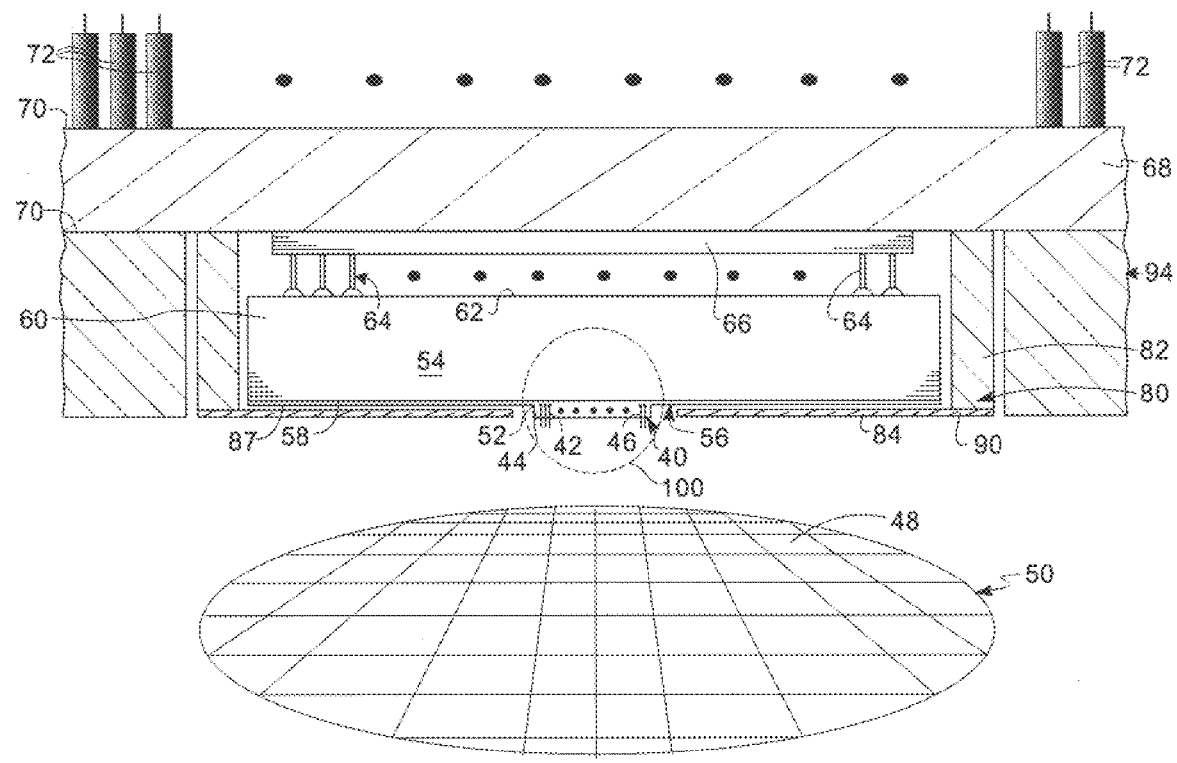
FIG. 2 is a schematic diagram of one embodiment of the probe structure of the present invention.
Figure 3:
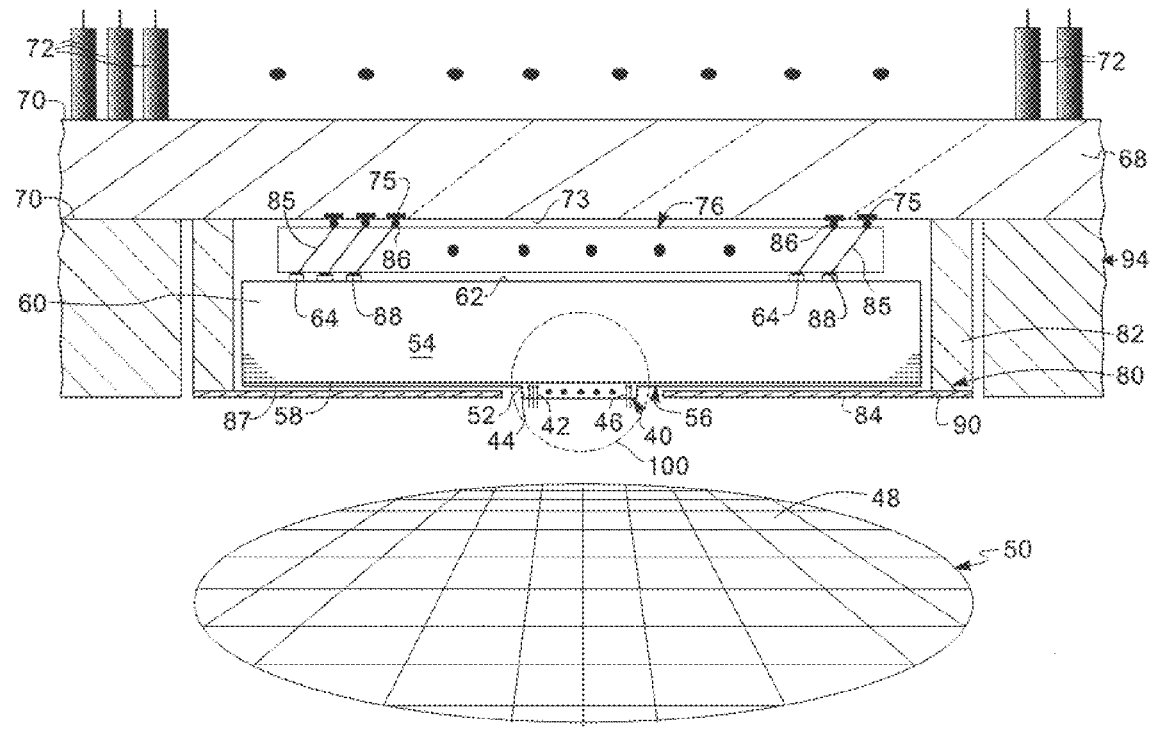
FIG. 3 is a schematic diagram of another embodiment of the probe structure of the present invention.

Turning now to the figures, FIGS. 2 and 3 show two embodiments of the test assembly according to the present invention. Numerals common between FIGS. 2 and 3 represent the same thing. Probe head 40 is formed from a plurality of elongated electrically conducting members 42 embedded in a material 44 which is preferably an elastomeric material 44. The elongated conducting members 42 have ends 46 for probing contact locations on integrated circuit devices 48 of wafer 50. In the preferred embodiment, the workpiece is an integrated circuit such as a semiconductor chip or a semiconductor wafer having a plurality of chips. The workpiece can be any other electronic device. The opposite ends 52 of elongated electrical conductors 42 are in electrical contact with space transformer (or fan-out substrate) 54. In the preferred embodiment, space transformer 54 is a multilevel metal/ceramic substrate, a multilevel metal/polymer substrate or a printed circuit board which are typically used as packaging substrates for integrated circuit chips. Space transformer 54 has, in the preferred embodiment, a surface layer 56 comprising a plurality of thin dielectric films, preferably polymer films such as polyimide, and a plurality of layers of electrical conductors, for example, copper conductors. A process for fabricating multilayer structure 56 for disposing it on surface 58 of substrate 60 to form a space transformer 54 is described in U.S. patent application Ser. No. 07/695,368, filed on May 3, 1991, entitled "MULTI-LAYER THIN FILM STRUCTURE AND PARALLEL PROCESSING METHOD FOR FABRICATING SAME" which is assigned to the assignee of the present invention, the teaching of which is incorporated herein by reference. Details of the fabrication of probe head 40 and of the assembly of probe head 40 and 54 will be described herein below.

As sown in FIG. 2, on surface 62 of substrate 60, there are, a plurality of pins 64. Surface 62 is opposite the surface 57 on which probe head 40 is disposed.

Pins 64 are standard pins used on integrated circuit chip packaging substrates. Pins 64 are inserted into socket 66 or plated through-holes in the substrate 68 which is disposed on surface 70 of second space transformer 68. Socket 66 is a type of pin grid array (PGA) socket such as commonly disposed on a printed circuit board of an electronic computer for receiving pins from a packaging substrate. Second space transformer 68 can be any second level integrated circuit packaging substrate, for example, a standard printed circuit board. Socket 66 is disposed on surface 70 of substrate 68. On opposite surface 70 of substrate 68 there are disposed a plurality of electrical connectors to which coaxial cables 72 are electrically connected. Alternatively, socket 68 can be a zero insertion force (ZIF) connector or the socket 68 can be replaced by through-holes in the substrate 68 wherein the through-holes have electrically conductive material surrounding the sidewalls such as a plated through-hole.

In the embodiment of FIG. 3, the pin 64 and socket 66 combination of the embodiment of FIG. 2 is replaced by an interposer, such as, elastomeric connector 76. The structure of elastomeric connector 76 and the process for fabricating elastomeric connector 76 is described in copending U.S. patent application Ser. No. 07/963,364 to B. Beaman et al., filed Oct. 19, 1992, entitled "THREE DIMENSIONAL HIGH PERFORMANCE INTERCONNECTION MEANS", which is assigned to the assignee of the present invention, the teaching of which is incorporated herein by reference and of which the present application is a continuation-in-part thereof, the priority date of the filing thereof being claimed herein. The elastomeric connector can be opted to have one end permanently bonded to the substrate, thus forming a FRU (field replacement unit) together with the probe/substrate/connector assembly.

Figure 4:
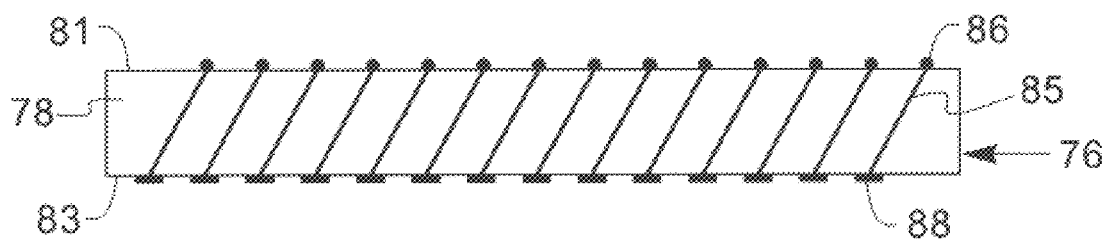
FIG. 4 is an enlarged view of an elastomeric connector electrically interconnecting two space transformation substrates of the structure of FIG. 2.

FIG. 4 shows a cross-sectional view of structure of the elastomeric connector 76 of FIG. 3. Connector 76 is fabricated of preferably elastomeric material 78 having opposing, substantially parallel and planar surfaces 80 and 82. Through elastomeric material 78, extending from surface 81 to 83 there are a plurality of elongated electrical conductors 85. Elongated electrical conductors 84 are preferably at a non-orthogonal angle to surfaces 81 and 83. Elongated conductors 85 are preferably wires which have protuberances 86 at surface 81 of elastomeric material layer 78 and flattened protuberances 88 at surface 83 of elastomeric material layer 78. Flattened protuberances 88 preferably have a projection on the flattened surface as shown for the structure of FIG. 14. Protuberance 86 is preferably spherical and flattened protuberance 88 is preferably a flattened sphere. Connector 76 is squeezed between surface 62 of substrate 54 and surface 73 of substrate 68 to provide electrical connection between end 88 of wires 85 and contact location 75 on surface 73 of substrate 68 and between end 88 or wires 85 and contact location 64 on surface 62 of substrate 54.

Alternatively, as shown in FIG. 17, connector 76 can be rigidly attached to substrate 54 by solder bonding ends 88 of wires 85 to pads 64 on substrate 54 or by wire bonding ends 86 of wires 85 to pads 64 on substrate 54 in the same manner that wires 42 are bonded to pads 106 as described herein below with respect to FIG. 5. Wires 85 can be encased in an elastomeric material in the same manner as wires 42 of FIG. 5.

Space transformer 54 is held in place with respect to second space transformer 68 by clamping arrangement 80 which is comprised of member 82 which is perpendicularly disposed with respect to surface 70 of second space transformer 68 and member 84 which is preferably parallely disposed with respect to surface 86 of first space transformer 54. Member 84 presses against surface 87 of space transformer 54 to hold space transformer 54 in place with respect surface 70 of space transformer 64. Member 82 of clamping arrangement 80 can be held in place with respect to surface 70 by a screw which is inserted through member 84 at location 90 extending through the center of member 82 and screw into surface 70.

The entire assembly of second space transformer 68 and first space transformer with probe head 40 is held in place with respect wafer 50 by assembly holder 94 which is part of an integrated circuit test tool or apparatus. Members 82, 84 and 90 can be made from material such as aluminum.

Figure 5:
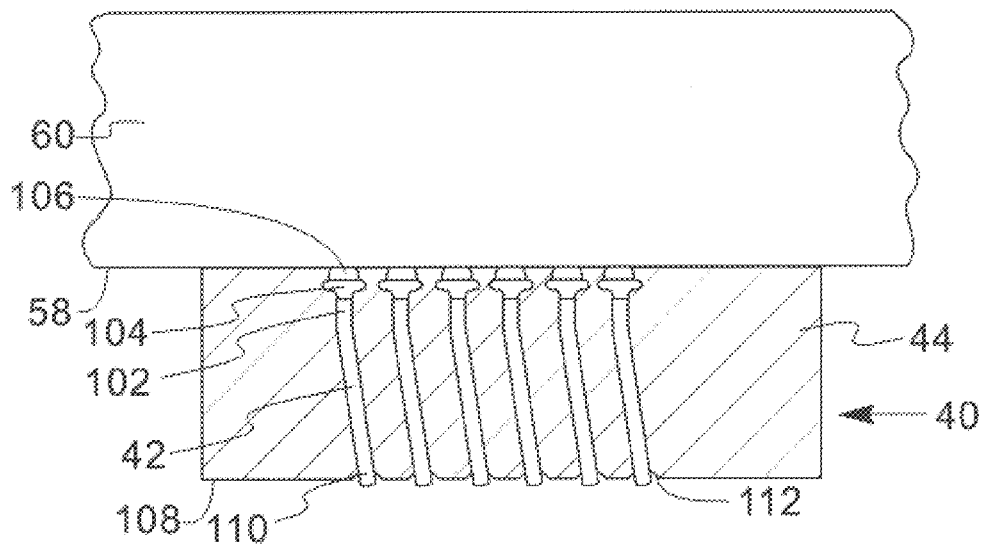
FIG. 5 is an enlarged view of the probe tip within dashed circle 100 of FIGS. 2 or 3.

FIG. 5 is an enlarged view of the region of FIGS. 2 or 3 closed in dashed circle 100 which shows the attachment of probe head 40 to substrate 60 of space transformer 54. In the preferred embodiment, elongated conductors 42 are preferably wires which are at a non-orthogonal angle with respect to surface 87 of substrate 60. At end 102 of wire 42 there is preferably a flattened protuberance 104 which is bonded (by wire bonding, solder bonding or any other known bonding technique) to electrically conducting pad 106 on surface 87 of substrate 60. Elastomeric material 44 is substantially flush against surface 87. At substantially oppositely disposed planar surface 108 elongated electrically conducting members 42 have an end 110. In the vicinity of end 110, there is optimally a cavity 112 surrounding end 110. The cavity is at surface 108 in the elastomeric material 44.

Figure 6:
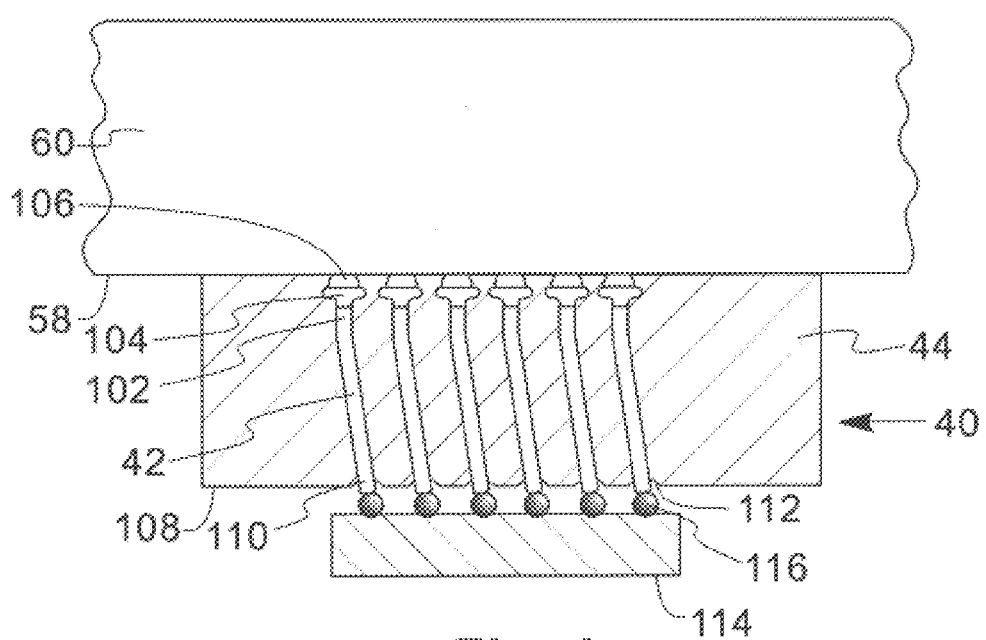
FIG. 6 shows the probe tip of the structure of FIG. 5 probing an integrated circuit device.

FIG. 6 shows the structure of FIG. 5 used to probe integrated circuit chip 114 which as a plurality of contact locations 116 shown as spheres such as a C4 solder balls. The ends 110 of conductors 42 are pressed in contact with contact locations 116 for the purpose of electrically probing integrated circuit 114. Cavity 112 provides an opening in elastomeric material 44 to permit ends 110 to be pressed towards and into solder mounds 116. Cavity 112 provides a means for solder mounds 116 to self align to ends 110 and provides a means containing solder mounds which may melt, seep or be less viscous when the probe is operated at an elevated temperature. When the probe is used to test or burn-in workpieces have flat pads as contact locations the cavities 112 can remain or be eliminated.

Figure 7:
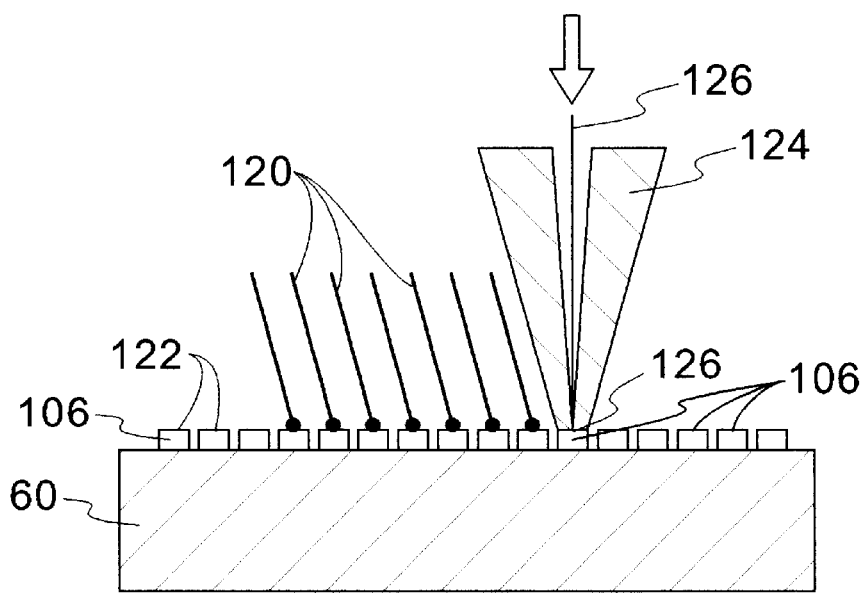
FIGS. 7–13 show the process for making the structure of FIG. 5.

FIGS. 7–13 show the process for fabricating the structure of FIG. 5. Substrate 60 with contact locations 106 thereon is disposed in a wire bond tool. The top surface 122 of pad 106 is coated by a method such as evaporation, sputtering or plating with soft gold or Ni/Au to provide a suitable surface for thermosonic ball bonding. Other bonding techniques can be used such as thermal compression bonding, ultrasonic bonding, laser bonding and the like. A commonly used automatic wire bonder is modified to ball bond gold, gold alloy, copper, copper alloy, aluminum, Pt, nickel or palladium wires 120 to the pad 106 on surface 122 as shown in FIG. 7. The wire preferably has a diameter of 0.001 to 0.005 inches. If a metal other than Au is used, a thin passivation metal such as Au, Cr, Co, Ni or Pd can be coated over the wire by means of electroplating, or electroless plating, sputtering, e-beam evaporation or any other coating techniques known in the industry. Structure 124 of FIG. 7 is the ball bonding head which has a wire 126 being fed from a reservoir of wire as in a conventional wire bonding apparatus. FIG. 7 shows the ball bond head 124 in contact at location 126 with surface 122 of pad 106.

Figure 8:
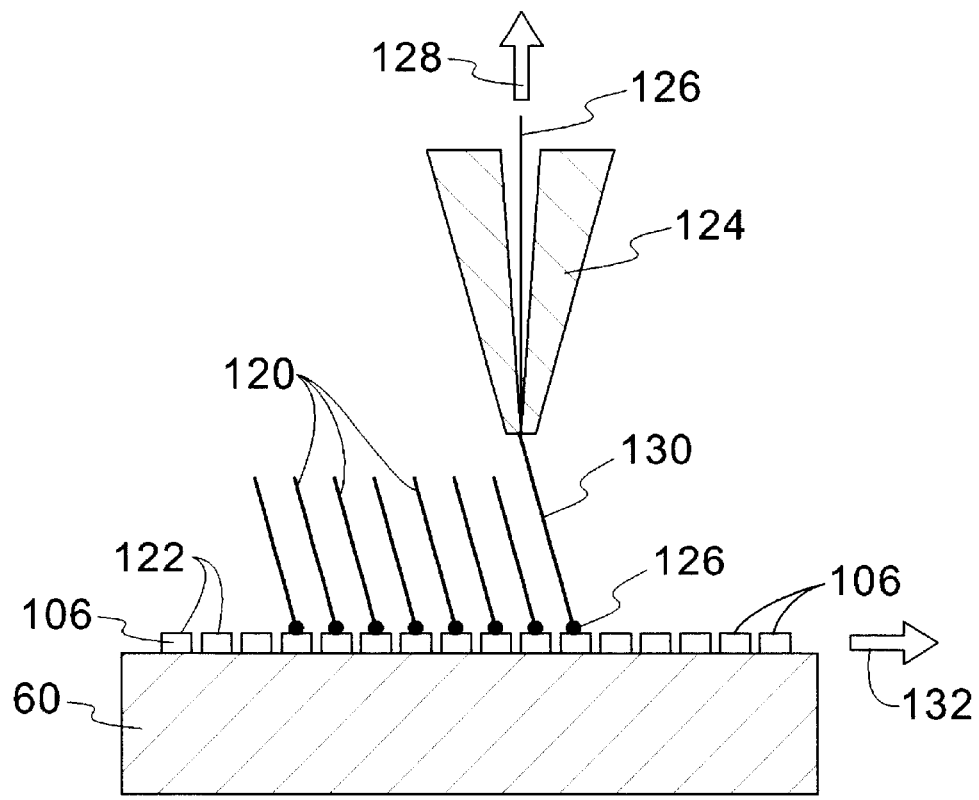
Figure 9:
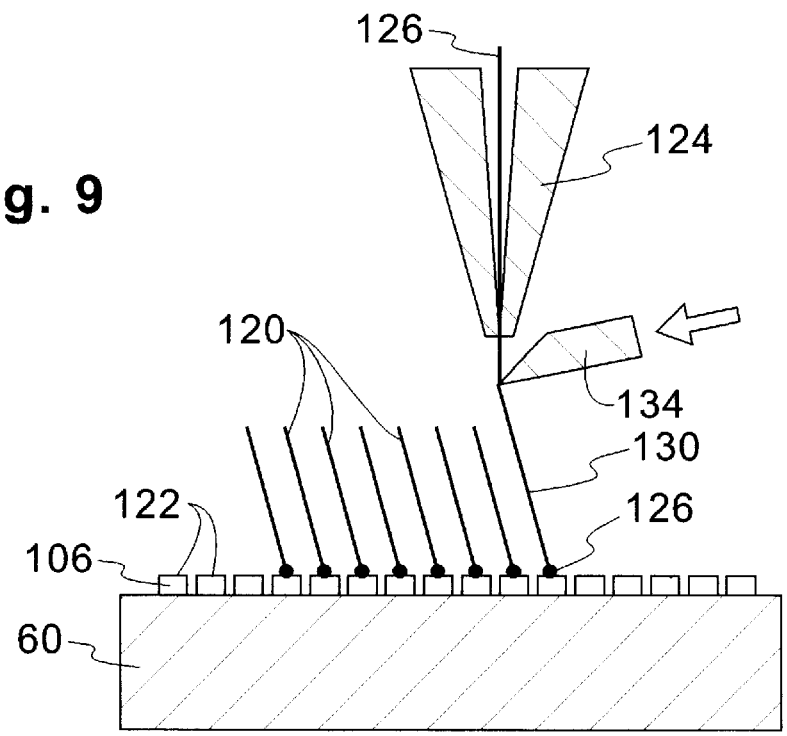

FIG. 8 shows the ball bonding head 124 withdrawn in the direction indicated by arrow 128 from the pad 106 and the wire 126 drawn out to leave disposed on the pad 106 surface 122 wire 130. In the preferred embodiment, the bond head 124 is stationary and the substrate 60 is advanced as indicated by arrow 132. The bond wire is positioned at an angle preferably between 5 to 60° from vertical and then mechanically notched (or nickel) by knife edge 134 as shown in FIG. 9. The knife edge 134 is actuated, the wire 126 is clamped and the bond head 124 is raised. The wire is pulled up and breaks at the notch or nick.

Cutting the wire 130 while it is suspended is not done in conventional wire bonding. In conventional wire bonding, such as that used to fabricate the electrical connector of U.S. Pat. No. 4,998,885, where, as shown in FIG. 8 thereof, one end a wire is ball bonded using a wire bonded to a contact location on a substrate bent over a loop post and the other of the wire is wedge bonded to an adjacent contact location on the substrate. The loop is severed by a laser as shown in FIG. 6 and the ends melted to form balls. This process results in adjacent contact locations having different types of bonds, one a ball bond the other a wedge bond. The spacing of the adjacent pads cannot be less than about ~20 mils because of the need to bond the wire. This spacing is unacceptable to fabricate a high density probe tip since dense integrated circuits have pad spacing less than this amount. In contradistinction, according to the present invention, each wire is ball bonded to adjacent contact locations which can be spaced less than 5 mils apart. The wire is held tight and knife edge 134 notches the wire leaving upstanding or flying leads 120 bonded to contact locations 106 in a dense array.

When the wire 130 is severed there is left on the surface 122 of pad 106 an angled flying lead 120 which is bonded to surface 122 at one end and the other end projects outwardly away from the surface. A ball can be formed on the end of the wire 130 which is not bonded to surface 122 using a laser or electrical discharge to melt the end of the wire. Techniques for this are described in copending U.S. patent application Ser. No. 07/963,346, filed Oct. 19, 1992, which is incorporated herein by reference above.

Figure 10:
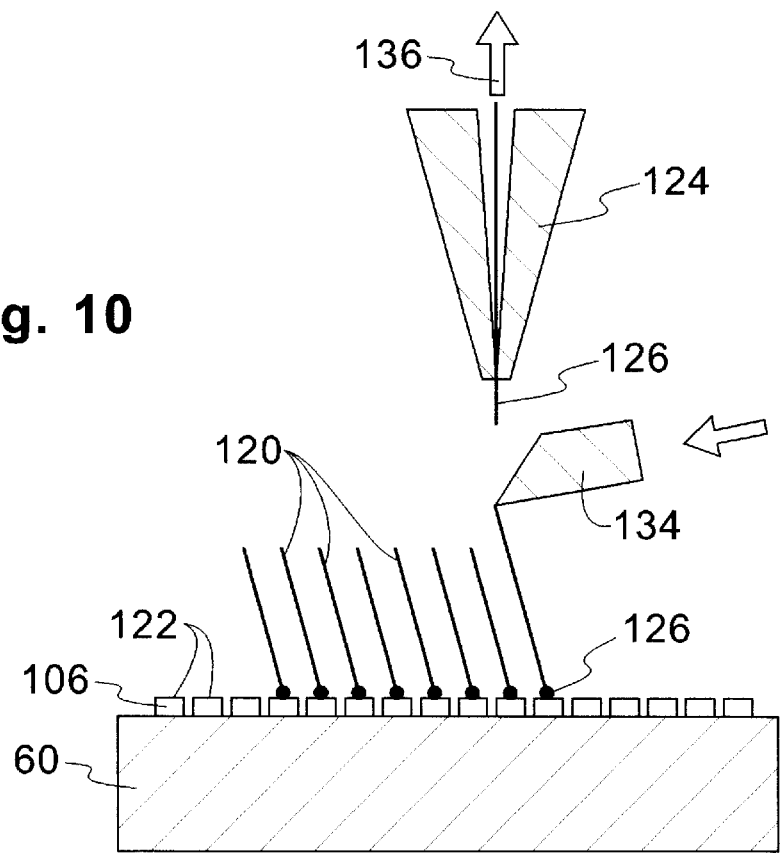

FIG. 10 shows the wire 126 notched (or nickel) to leave wire 120 disposed on surface 122 of pad 106. The wire bond head 124 is retracted upwardly as indicated by arrow 136. The wire bond head 124 has a mechanism to grip and release wire 126 so that wire 126 can be tensioned against the shear blade to sever the wire.

Figure 11:
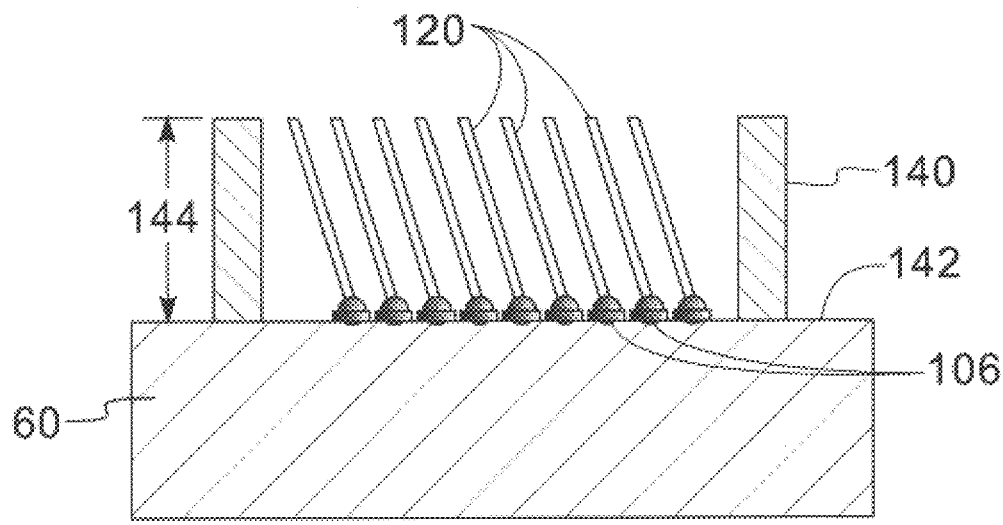
Figure 12:
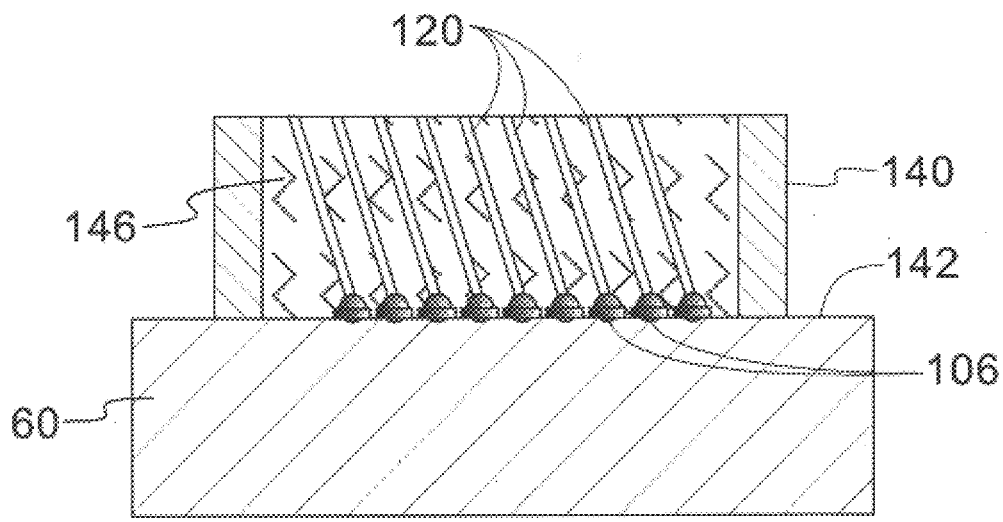
Figure 13:
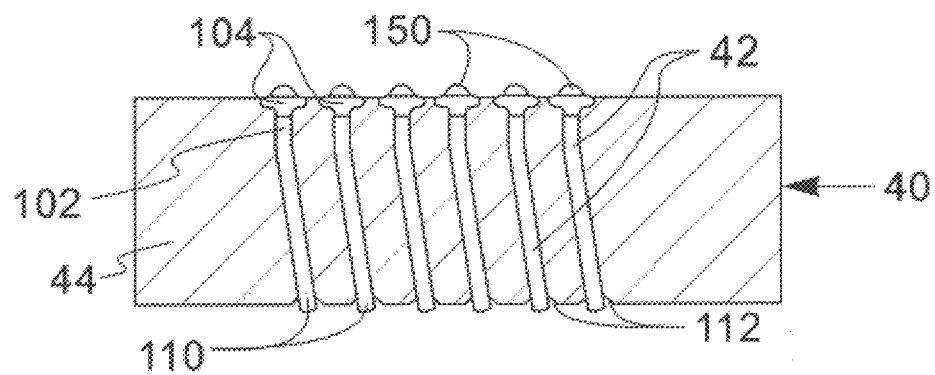

After the wire bonding process is completed, a casting mold 140 as shown in FIG. 11 is disposed on surface 142 of substrate 60. The mold is a tubular member of any cross-sectional shape, such as circular and polygonal. The mold is preferably made of metal or organic materials. The length of the mold is preferably the height 144 of the wires 120. A controlled volume of liquid elastomer 146 is disposed into the casting 140 mold and allowed to settle out (flow between the wires until the surface is level) before curing as shown in FIG. 13. Once the elastomer has cured, the mold is removed to provide the structure shown in FIG. 5 except for cavities 112. The cured elastomer is represented by reference numeral 44. A mold enclosing the wires 120 can be used so that the liquid elastomer can be injection molded to encase the wires 120.

The top surface of the composite polymer/wire block can be mechanically planarized to provide a uniform wire height and smooth polymer surface. A moly mask with holes located over the ends of the wire contacts is used to selectively ablate (or reactive ion etch) a cup shaped recess in the top surface of the polymer around each of the wires. The probe contacts can be reworked by repeating the last two process steps A high compliance, high thermal stability siloxane elastomer material is preferable for this application. The compliance of the cured elastomer is selected for the probe application. Where solder mounds are probed a more rigid elastomeric is used so that the probe tips are pushed into the solder mounds where a gold coated aluminum pad is being probed a more compliant elastomeric material is used to permit the wires to flex under pressure so that the probe ends in contact with the pad will move to wipe over the pad so that good electrical contact is made therewith. The high temperature siloxane material is cast or injected and cured similar to other elastomeric materials. To minimize the shrinkage, the elastomer is preferably cured at lower temperatures ($T \leq 60°$) followed by complete cure at higher temperatures ($T \geq 80°$).

Among the many commerically available elastomers, such as ECCOSIL and SYLGARD, the use of polydimethylsiloxane based rubbers best satisfy both the material and processing requirements. However, the thermal stability of such elastomers is limited at temperatures below 200° C. and significant outgassing is observed above 100° C. We have found that the thermal stability can be significantly enhanced by the incorporation of 25 wt % or more diphenylsiloxane. Further, enhancement in the thermal stability has been demonstrated by increasing the molecular weight of the resins (oligomers) or minimizing the cross-link junction. The outgassing of the elastomers can be minimized at temperatures below 300° C. by first using a thermally transient catalyst in the resin synthesis and secondly subjected the resin to a thin film distillation to remove low molecular weight side-products. For our experiments, we have found that 25 wt % diphenylsiloxane is optimal, balancing the desired thermal stability with the increased viscosity associated with diphenylsiloxane incorporation. The optimum number average molecular weight of the resin for maximum thermal stability was found to be between 18,000 and 35,000 g/mol. Higher molecular weights are difficult to cure and too viscous, once filled, to process. Network formation was achieved by a standard hydrosilylation polymerization using a hindered platinum catalyst in a reactive silicon oil carrier.

In FIG. 10 when bond head 124 bonds the wire 126 to the surface 122 of pad 106 there is formed a flattened spherical end shown as 104 in FIG. 6.

The high density test probe provides a means for testing high density and high performance integrated circuits in wafer form or as discrete chips. The probe contacts can be designed for high performance functional testing or high temperature burn-in applications. The probe contacts can also be reworked several times by resurfacing the rigid polymer material that encases the wires exposing the ends of the contacts.

The high density probe contacts described in this disclosure are designed to be used for testing semiconductor devices in either wafer form or as discrete chips. The high density probe uses metal wires that are bonded to a rigid substrate. The wires are imbedded in a rigid polymer that has a cup shaped recess around each to the wire ends. The cup shaped recess 112 shown in FIG. 5 provides a positive self-aligning function for chips with solder ball contacts. A plurality of probe heads 40 can be mounted onto a space transformation substrate 60 so that a plurality of chips can be probed an burned-in simultaneously.

An alternate embodiment of this invention would include straight wires instead of angled wires. Another alternate embodiment could use a suspended alignment mask for aligning the chip to the wire contacts instead of the cup shaped recesses in the top surface of the rigid polymer. The suspended alignment mask is made by ablating holes in a thin sheet of polyimide using an excimer laser and a metal mask with the correct hole pattern. Another alternate embodiment of this design would include a interposer probe assembly that could be made separately from the test substrate as described in U.S. patent application, Ser. No. 07/963,364, incorporated by reference herein above. The design could be fabricated by using a copper substrate that would be etched away after the probe assembly is completed and the polymer is cured. This approach could be further modified by using an adhesion de-promoter on the wires to allow them to slide freely (along the axis of the wires in the polymer material.

Figure 14:
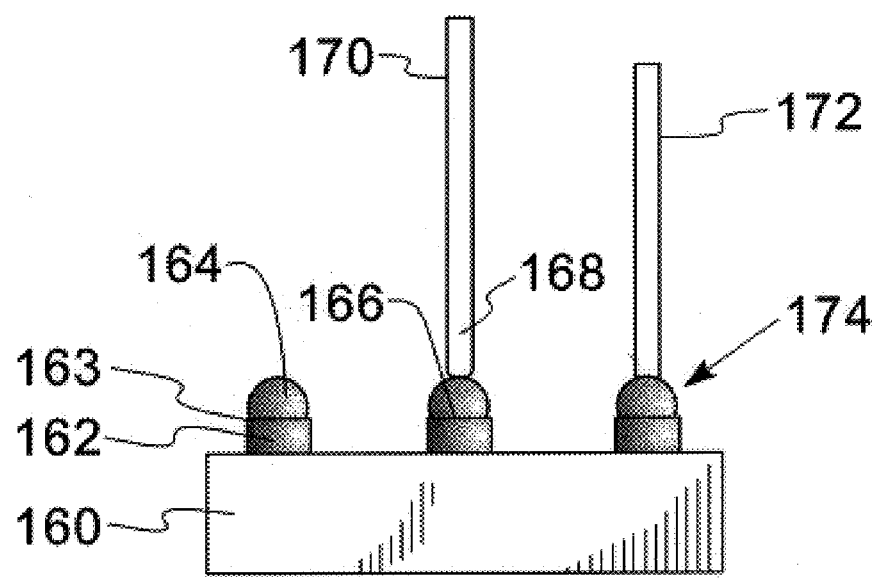
FIG. 14 shows a probe tip structure without a fan-out substrate.

FIG. 14 shows an alternate embodiment of probe tip 40 of FIGS. 2 and 3. As described herein above, probe tip 40 is fabricated to be originally fixed to the surface of a first level space transformer 54. Each wire 120 is wire bonded directly to a pad 106 on substrate 60 so that the probe assembly 40 is rigidly fixed to the substrate 60. The embodiment of FIG. 14, the probe head assembly 40 can be fabricated via a discrete stand alone element. This can be fabricated following the process of U.S. patent application Ser. No. 07/963, 348, filed Oct. 19, 1992, which has been incorporated herein by reference above. Following this fabrication process as described herein above, wires 42 of FIG. 14 are wire bonded to a surface. Rather than being wire bonded directly to a pad on a space transformation substrate, wire 42 is wire bonded to a sacrificial substrate as described in the application incorporated herein. The sacrificial substrate is removed to leave the structure of FIG. 14. At ends 102 of wires 44 there is a flattened ball 104 caused by the wire bond operation. In a preferred embodiment the sacrificial substrate to which the wires are bonded have an array of pits which result in a protrusion 150 which can have any predetermined shape such as a hemisphere or a pyramid. Protrusion 150 provides a raised contact for providing good electrical connection to a contact location against which it is pressed. The clamp assembly 80 of FIGS. 2 and 3 can be modified so that probe tip assembly 40 can be processed towards surface 58 of substrate 60 so that ends 104 of FIG. 14 can be pressed against contact locations such as 106 of FIG. 5 on substrate 60. Protuberances 104 are aligned to pads 100 on surface 58 of FIG. 5 in a manner similar to how the conductor ends 86 and 88 of the connector in FIG. 4 are aligned to pads 75 and 64 respectively.

Figure 15:
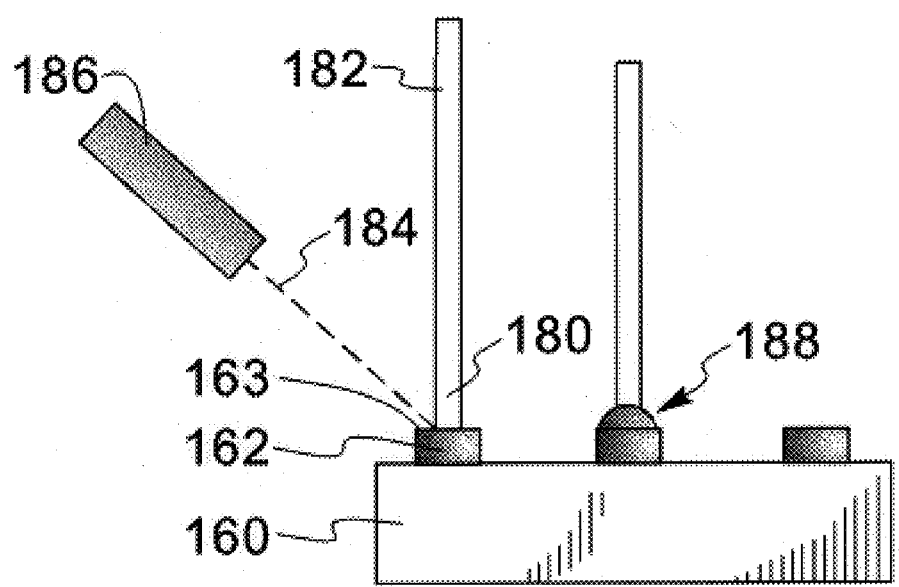
FIG. 15 shows the elongated conductors of the probe tip fixed by solder protuberances to contact locations on a space transformation substrate.

As shown in the process of FIGS. 7 to 9, wire 126 is ball bonded to pad 106 on substrate 60. An alternative process is to start with a substrate 160 as shown in FIG. 15 having contact locations 162 having an electrically conductive material 164 disposed on surface 166 of contact location 162. Electrically conductive material 164 can be solder. A bond lead such as 124 of FIG. 7 can be used to dispose end 168 of wire 170 against solder mound 164 which can be heated to melting. End 168 of wire 170 is pressed into the molten solder mount to form wire 172 embedded into a solidified solder mound 174. Using this process a structure similar to that of FIG. 5 can be fabricated.

Figure 16:
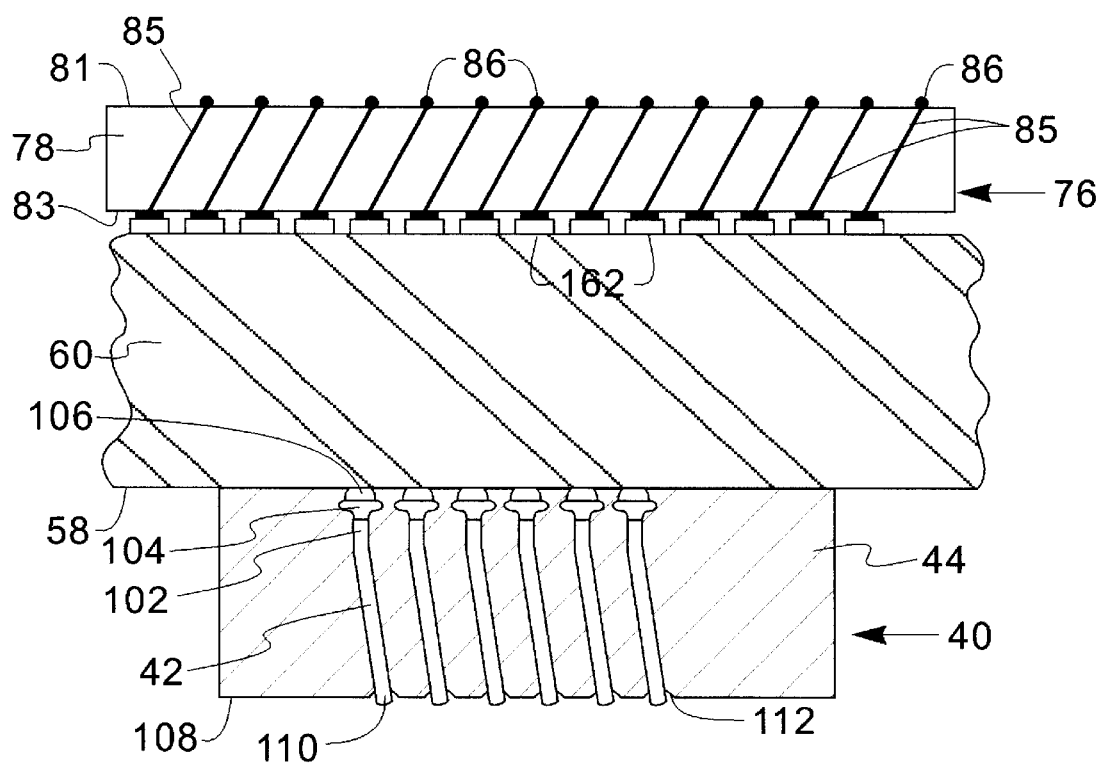
FIG. 16 shows the elongated conductors of the probe tip fixed by laser weld protuberances to contact locations on a space transformation substrate.

FIG. 16 shows another alternative embodiment of a method to fabricate the structure of FIG. 5.

Numerals common between FIGS. 15 and 16 represent the same thing. End 180 elongated electrical conductor 182 is held against top surface 163 of pad 162 on substrate 160. A beam of light 184 from laser 186 is directed at end 180 of elongated conductor 182 at the location of contact with surface 163 of pad 162. The end 180 is laser welded to surface 163 to form protuberance 186.

In summary, the present invention is directed to high density test probe for testing high density and high performance integrated circuits in wafer form or as discrete chips. The probe contacts are designed for high performance functional testing and for high temperature burn in applications. The probe is formed from an elastomeric probe tip having a highly dense array of elongated electrical conductors embedded in an elastomeric material which is in electrical contact with a space transformer.

While the present invention has been described with respect to preferred embodiments, numerous modifications, changes and improvements will occur to those skilled in the art without departing from the spirit and scope of the invention.

What is claimed is:

1. A method comprising:
    providing a surface that has a plurality of bondable locations;
    bonding a wire to each of said bondable locations;
    drawing said wire away from said bondable location and holding an end of said wire in place, while said wire is held in place forming a notch in said wire with a knife edge;
    said notch is formed at a selected location on said wire;
    pulling said wire to break said wire at said notch leaving a free-standing wire bonded at one end to said bondable location;
    said wire projecting away from said surface and terminating in a free end;
    said wire has a predetermined shape permitting said free end to wipe a surface of an electrical contact against which said free end is pressed as said surface is moved toward said surface of said electrical contact;
    said wire and said free end have an original position, said wire and said predetermined shape permit said free end and said wire as said free end is pressed against said surface of said electrical contact to move away from said original position and permits said wire and said free end to substantially return to said original position when said free end is retracted from being pressed against said surface of said electrical contact.

2. A method according to claim 1 wherein said free-standing wire is nonlinear.

3. A method according to claim 1 wherein said wire has a linear portion.

4. A method according to claim 1 wherein said wire has a linear portion making a nonorthogonal angle to said surface.

5. A method according to claim 1 wherein said bondable location is a wire bondable location.

6. A method according to claim 5 wherein said wire is bonded with a wire bonding tool.

7. A method according to claim 6 wherein said wire bonding tool is drawn away from said surface to form a desired shape to said wire.

8. A method according to claim 7 wherein said end is cut with a knife edge to form said cut end.

9. A method of claim 1 wherein a plurality of wires are bonded to a plurality of bondable locations to form a plurality of free-standing wires.

10. A method according to claim 9 further including disposing a mold to surround said plurality of free-standing wires.

11. A method according to claim 10, further including:
    adding to said mold a curable compound to form a cured compound removing said mold to leave said plurality of free-standing wires embedded in said cured compound.

12. A method according to claim 1, wherein said wire is formed to have a predetermined shape, said predetermined shape permits said probe tips to wipe the surface of an electrical contact against which said probe tip is pressed as said surface is moved towards said electronic device.

13. A method comprising:
    providing a surface that has a plurality of bondable locations;
    bonding a wire to each of said plurality of bondable locations by the same type of bond to form an apparatus comprising a plurality of wires projecting away from said surface, the end of each wire comprising a tip;
    forming each of said wires into a predetermined shape;
    said predetermined shape permits said tips to wipe the surface of an electrical contact against which said probe tip is pressed as said surface is moved towards said contact.

14. A method according to claim 13 further including:
    pressing said tip against said surface of said electrical contact so that said tip wipes said surface of said electrical contact.

15. A method according to claim 1 further including:
    pressing said free end against said surface of said electrical contact so that said free end moves away from said original position, and retracting said free end from contacting said electrical contact so that said free end substantially returns to said original position.

16. A method comprising:
    providing a surface that has a plurality of bondable locations;
    bonding a wire to each of said plurality of said bondable locations by the same type bonding operation;
    drawing said wire away from said bondable location and holding an end of said wire in place, forming a notch at a selected location in said wire, pulling said wire while said wire is held in place to break said wire at said notch to form a dangling end;
    said wire projecting away from said surface and terminating in said dangling end;
    said wire has a predetermined shape permitting said dangling end to wipe a surface of an electrical contact against which said dangling end is pressed as said surface of said electrical contact is moved toward said electrical contact;
    said wire and said dangling end have an original position, said wire and said predetermined shape permit said dangling end and said wire as said dangling end is pressed against said surface of said electrical contact to move away from said original position and permits said wire and said dangling end to substantially return to said original position when said dangling end is retracted from being pressed against said surface of said electrical contact.

17. A method according to claim 16 wherein said dangling end is formed by cutting said wire leaving a free-standing wire bonded at one end to said bondable location.

18. A method according to claim 16 wherein said wire is a free-standing wire which is nonlinear.

19. A method according to claim 16 wherein said wire has a linear portion.

20. A method according to claim 16 wherein said wire has a linear portion making a nonorthogonal angle to said surface.

21. A method according to claim 16 wherein said bondable location is a wire bondable location.

22. A method according to claim 21 wherein said wire is bonded with a wire bonding tool.

23. A method according to claim 22 wherein said wire bonding tool is drawn away from said surface to form a desired shape to said wire.

24. A method according to claim 23 wherein said dangling end is formed by cutting said wire with a knife edge to form said dangling end.

25. A method of claim 16 wherein a plurality of wires are bonded to a plurality of bondable locations to form a plurality of free-standing wires.

26. A method according to claim 25 further including disposing a mold to surround said plurality of free-standing wires.

27. A method according to claim 26, further including:
adding to said mold a curable compound to form a cured compound and removing said mold to leave said plurality of free-standing wires embedded in said cured compound.

28. A method according to claim 16 wherein said bonding operation is selected from the group consisting of wire bonding, solder bonding and laser welding.

29. A method according to claim 16, wherein said wire is formed to have a predetermined shape, said predetermined shape permits said probe tips to wipe the surface of an electrical contact against which said probe tip is pressed as said surface is moved towards said electronic device.

30. A method according to claim 16 further including:
pressing said dangling end against said surface of said electrical contact so that said dangling end moves away from said original position, and retracting said dangling end from contacting said surface of said electrical contact so that said dangling end substantially returns to said original position.

31. A method comprising:
providing a surface that has a plurality of bondable locations;
bonding a wire to each of said plurality of bondable locations by the same type of bond to form an electronic device probe, said wire has an end which is bonded to said bondable location, thereafter said wire is pulled away from said bondable location and thereafter said wire is severed at a selected location at a second end to form a free-standing wire bonded to said bondable location, said wire is severed by forming a notch in said wire with a knife edge clamping said wire and pulling said wire to bread said wire at said notch;
said wire has a predetermined shape permitting said second end to wipe a surface of an electrical contact against which said second end is pressed as said surface is moved toward said surface of said electrical contact;
said wire and said second end have an original position, said wire and said predetermining shape permit said second end and said wire as said second end is pressed against said surface of said electrical contact to move away from said original position and permits said wire and said second end to substantially return to said original position when said second end is retracted from being pressed against said surface of said electrical contact.

32. A method according to claim 31 further including electrically probing an electronic device with said electronic device probe.

33. A method according to claim 25, wherein said wire is formed to have a predetermined shape, said predetermined shape permits said probe tips to wipe the surface of an electrical contact against which said probe tip is pressed as said surface is moved towards said electronic device.

34. A method according to claim 31 further including:
pressing said second end against said surface of said electrical contact so that said second end moves away from said original position, and retracting said second end from being pressed against said surface of said electrical contact so that substantially returns to said original position.

35. A method of making a probe for probing an electronic device comprising:
providing a surface that has a plurality of locations;
bonding a wire to each of said bondable location to form a plurality of bonded wires;
drawing said wire away from said bondable location and shaping said wire to have a predetermined shape;
severing each of said wires at a selected location to result in a plurality of a free-standing wires bonded at one end to said bondable location;
said wire projecting away from said surface and terminating at a terminal end;
said predetermined shape permits said terminal end to wipe a surface of an electrical contact against which said terminal end is pressed as said surface is moved toward said electrical contact;
said wire and said terminal end have an original position, said wire and said predetermined shape permit said terminal end and said wire as said terminal end is pressed against said surface of said electrical contact to move away from said original position and permits said wire and said terminal end to substantially return to said original position when said terminal end is retracted from being pressed against said surface of said electrical contact.

36. A method according to claim 35 further including:
pressing said terminal end against said surface of said electrical contact so that said terminal end moves away from said original position, and retracting said terminal end from being pressed against said surface of said electrical contact so that said wire and said terminal end substantially returns to said original position.

37. A method for making a probe for probing an electronic device comprising:
providing a surface that has a plurality of bondable locations;
bonding a wire to each of said plurality of said bondable locations by the same type bonding operation;
drawing said wire away from said bondable location, shaping said wire to have a predetermined shape and severing said wire at a selected location to form a dangling end;
said wire projecting away from said surface and terminating in said dangling end;
said predetermined shape permits said dangling end to wipe a surface of an electrical contact against which said dangling end is pressed as said surface is moved towards said electrical contact;

said wire and said dangling end have an original position, said wire and said predetermined shape permit said dangling end and said wire as said dangling end is pressed against said surface of said electrical contact to move away from said original position permitting said dangling end and said wire to substantially return to said original position when said dangling end is retracted from being pressed against said surface of said electrical contact.

38. A method according to claim 37 further including:

pressing said dangling end against said surface of said electrical contact so that said dangling end moves away from said original position, and retracting said dangling end from pressing against said surface of said electrical contact so that said dangling end substantially returns to said original position.

39. A method comprising:

providing a surface that has a plurality of bondable locations;

bonding a wire of selected length to each of said plurality of bondable locations by the same type of bond to form an electronic device probe comprising a plurality of wires projecting away from said surface terminating in a terminal end;

forming each of said wires into a predetermined shape;

said predetermined shape permits said terminal end to wipe a surface of an electrical contact against which said terminal end is pressed as said surface is moved towards said surface of said electrical contact;

said wire and said terminal end have an original position, said wire and said predetermined shape permit said terminal end and said wire as terminal end is pressed against said surface of said electrical contact to move away from said original position and permits said terminal end and said wire to substantially return to said original position when said terminal end is retracted from being pressed against said surface.

40. A method according to claim 39 further including:

pressing said terminal end against said surface of said electrical contact so that said terminal end moves away from said original position, and retracting said terminal end from pressing against said surface of said electrical contact so that said terminal end and said wire substantially returns to said original position.

41. A method of making an apparatus for making electrical contact to a device comprising:

providing a surface that has a plurality of locations;

bonding a wire to each of said bondable location to form a plurality of bonded wires;

drawing said wire away from said bondable location and shaping said wire to have a predetermined shape;

severing each of said wires at a selected location to result in a plurality of a free-standing wire bonded at one end to said bondable location;

said wire projecting away from said surface and terminating at severed end;

said severed ends comprise tips;

moving said apparatus towards said device;

said predetermined shape permits said tips to wipe the surface of an electrical contact against which said tip is pressed as said surface is moved toward said device.

42. A method according to claim 41 further including:

pressing said tip against said surface of said electrical contact so that said tip wipes said surface of said electrical contact.

43. A method for making an apparatus for making electrical contact to a device comprising:

providing a surface that has a plurality of bondable locations;

bonding a wire to each of said plurality of said bondable locations by the same type bonding operation;

drawing said wire away from said bondable location, severing said wire at a selected location and shaping said wire to have a predetermined shape to form a dangling end;

said dangling ends comprise tips;

said wire projecting away from said surface and terminating in said dangling end;

said predetermined shape permits said tips to wipe the surface of an electrical contact against which said probe tip is pressed as said surface is moved toward said contact.

44. A method according to claim 43 further including:

pressing said tip against said surface of said electrical contact so that said tip wipes said surface of said electrical contact.

45. A method for making an apparatus for making electrical contact to a device comprising:

providing a surface that has a plurality of bondable locations;

bonding a wire to each of said plurality of said bondable locations by the same type bonding operation;

drawing said wire away from said bondable location and shaping said wire to have a predetermined shape to form a dangling end;

said dangling ends comprise tips;

said wire projecting away from said surface and terminating in said dangling end;

moving said wire out of a wire supply and moving said wire supply with respect to said bondable location by moving said wire supply with respect to said surface in a direction both perpendicular to said surface and in a direction parallel to said surface to shape said wire to have a predetermined shape;

severing each of said wires at a selected location to result in a plurality of free-standing wires having said predetermined shape bonded at one end to said bondable location;

said wire projecting away from said surface and terminating at said severed end;

said severed ends comprise probe tips;

said predetermined shape permits said probe tips to wipe the surface of an electrical contact against which said probe tip is pressed as said surface is moved toward said electronic device.

46. A method according to claim 45 further including:

pressing said probe tip against said surface of said electrical contact so that said probe tip wipe the surface of said electrical contact.

47. A method of making a probe for probing an electronic device comprising:

providing a surface that has a plurality of bondable locations;

bonding a wire to each of said bondable location to form a plurality of bonded wires;

moving said wire out of a wire supply and moving said wire supply with respect to said bondable location by moving said wire supply with respect to said surface in a direction both perpendicular to said surface and in a direction parallel to said surface to shape said wire to have a predetermined shape;

severing each of said wires at a selected location to result in a plurality of free-standing wires having said predetermined shape bonded at one end to said bondable location;

said wire projecting away from said surface and terminating at said severed end;

said severed ends comprise probe tips;

said predetermined shape permits said probe tips to wipe the surface of an electrical contact against which said probe tip is pressed as said surface is moved toward said electronic device.

48. A method according to claim 47 further including:

pressing said probe tip against said surface of said electrical contact so that said probe tip wipes the surface of said electrical contact.

49. A method for making a probe for probing an electronic device comprising:

providing a surface that has a plurality of bondable locations;

bonding a wire to each of said plurality of said bondable locations by the same type bonding operation;

moving said wire out of a wire supply and moving said wire supply with respect to said bondable location by moving said wire supply with respect to said surface in a direction both perpendicular to said surface and in a direction parallel to said surface to shape said wire to have a predetermined shape and severing said wire at a selected location to form a dangling end;

said dangling ends comprise probe tips;

said wire projecting away from said surface and terminating in said dangling end;

said predetermined shape permits said probe tips to wipe the surface of an electrical contact against which said probe tip is pressed as said surface is moved towards said electronic device.

50. A method according to claim 49 further including:

pressing said probe tip against said surface of said electrical contact so that said probe tip wipes the surface of said electrical contact.

51. A method comprising:

providing a surface that has a plurality of bondable locations;

bonding a wire to each of said plurality of said bondable locations by the same type of bond to form an electronic device probe comprising a plurality of wires projecting away from said surface, the end of each wire comprising a probe tip;

forming each of said wires into a predetermined shape by moving said wire out of a wire supply and moving said wire supply with respect to said bondable location by moving said wire supply with respect to said surface in a direction both perpendicular to said surface and in a direction parallel to said surface to shape said wire to have said predetermined shape;

severing said wire at a selected location;

said predetermined shape permits said probe tips to wipe the surface of an electrical contact against which said probe tip is pressed as said surface is moved towards said electronic device.

52. A method according to claim 51 further including:

pressing said probe tip against said surface of said electrical contact so that said probe tip wipes the surface of said electrical contact.

53. A method of making an apparatus for making electrical contact to a device comprising:

providing a surface that has a plurality of locations;

bonding a wire to each of said bondable location to form a plurality of bonded wires;

moving said wire out of a supply and moving said wire supply with respect to said bondable location by moving said wire supply with respect to said surface in a direction both perpendicular to said surface and in a direction parallel to said surface to shape said wire to have a predetermined shape;

severing each of said wires at a selected location to result in a plurality of a free-standing wire each bonded at one end to said bondable location;

said wire projecting away from said surface and terminating at a severed end;

said severed ends comprise tips;

said predetermined shape permits said tip to wipe the surface of an electrical contact against which said tip is pressed as said surface is moved toward said device.

54. A method according to claim 53 further including:

pressing said probe tip against said surface of said electrical contact so that said probe tip wipes the surface of said electrical contact.

55. A method for making an apparatus for making electrical contact to a device comprising:

providing a surface that has a plurality of bondable locations;

bonding a wire to each of said plurality of said bondable locations by the same type bonding operation;

moving said wire out of a wire supply and moving said wire supply with respect to said bondable location by moving said wire supply with respect to said surface in a direction both perpendicular to said surface and in a direction parallel to said surface to shape said wire to have a predetermined shape and severing said wire at a selected location to form a dangling end;

said dangling ends comprise tips;

said wire projecting away from said surface and terminating in said dangling end;

said predetermined shape permits said tip to wipe the surface of an electrical contact against which said tip is pressed as said surface is moved towards said device.

56. A method according to claim 55 further including:

pressing said probe tip against said surface of said electrical contact so that said probe tip wipes the surface of said electrical contact.

57. A method comprising:

providing a surface that has a plurality of bondable locations;

bonding a wire of selected length to each of said plurality of bondable locations by the same type of bond to form an apparatus comprising a plurality of wires projecting away from said surface, the end of each wire comprising a tip;

forming each of said wires into a predetermined shape by moving said wire out of a wire supply and moving said wire supply with respect to said bondable location by moving said wire supply with respect to said surface in a direction both perpendicular to said surface and in a direction parallel to said surface to shape said wire into said predetermined shape;

said predetermined shape permits said tip to wipe the surface of an electrical contact against which said probe tip is pressed as said surface is moved towards said contact.

58. A method according to claim 57 further including:
pressing said probe tip against said surface of said electrical contact so that said probe tip wipes the surface of said electrical contact.

59. A method comprising:
providing a surface that has a plurality of bondable locations;
bonding a wire to each of said plurality of bondable locations to form an electronic device probe comprising a plurality of wires of selected length projecting away from said surface terminating in a terminal end;
forming each of said wires into a predetermined shape;
said predetermined shape permits said terminal end to wipe a surface of an electrical contact against which said terminal end is pressed as said surface is moved towards said surface of said electrical contact;
said wire and said terminal end have an original position, said wire and said predetermined shape permit said terminal end and said wire as terminal end is pressed against said surface of said electrical contact to move away from said original position and permits said terminal end and said wire to substantially return to said original position when said terminal end is retracted from being pressed against said surface.

60. A method according to claim 59 further including:
pressing said terminal end against said surface of said electrical contact so that said terminal end moves away from said original position, and retracting said terminal end from pressing against said surface of said electrical contact so that said terminal end and said wire substantially returns to said original position.

61. A method comprising:
providing a surface that has a plurality of bondable locations;
bonding a wire to each of said plurality of bondable locations to form an electrical device comprising a plurality of wires of selected length projecting away from said surface terminating in a terminal end;
forming each of said wires into a predetermined shape;
said predetermined shape permits said terminal end to wipe a surface of an electrical contact against which said terminal end is pressed as said surface is moved towards said surface of said electrical contact;
said wire and said terminal end have an original position, said wire and said predetermined shape permit said terminal end and said wire as terminal end is pressed against said surface of said electrical contact to move away from said original position and permits said terminal end and said wire to substantially return to said original position when said terminal end is retracted from being pressed against said surface.

62. A method according to claim 61 further including:
pressing said terminal end against said surface of said electrical contact so that said terminal end moves away from said original position and retracting said terminal end from pressing against said surface of said electrical contact so that said terminal end and said wire substantially returns to said original position.

63. A method according to claim 1 or 15, wherein said surface has a perimeter, said free end is positioned with respect to said surface so that a perpendicular line from said free end intersects said surface within said perimeter.

64. A method according to claim 16 or 30, wherein said surface has a perimeter, said dangling end is positioned with respect to said surface so that a perpendicular line from said dangling end intersects said surface within said perimeter.

65. A method according to claim 31 or 34, wherein said surface has a perimeter, said second end is positioned with respect to said surface so that a perpendicular line from said second end intersects said surface within said perimeter.

66. A method according to claim 35 or 36, wherein said surface has a perimeter, said terminal end is positioned with respect to said surface so that a perpendicular line from said terminal end intersects said surface within said perimeter.

67. A method according to claim 37 or 38, wherein said surface has a perimeter, said dangling end is positioned with respect to said surface so that a perpendicular line from said dangling end intersects said surface within said perimeter.

68. A method according to claim 39 or 40, wherein said surface has a perimeter, said terminal end is positioned with respect to said surface so that a perpendicular line from said terminal end intersects said surface within said perimeter.

69. A method according to claim 41 or 42, wherein said surface has a perimeter, said tip is positioned with respect to said surface so that a perpendicular line from said tip intersects said surface within said perimeter.

70. A method according to claim 43 or 44, wherein said surface has a perimeter, said tip is positioned with respect to said surface so that a perpendicular line from said tip intersects said surface within said perimeter.

71. A method according to claim 13 or 14, wherein said surface has a perimeter, said tip is positioned with respect to said surface so that a perpendicular line from said tip intersects said surface within said perimeter.

72. A method according to claim 45 or 46, wherein said surface has a perimeter, said probe tip is positioned with respect to said surface so that a perpendicular line from said probe tip intersects said surface within said perimeter.

73. A method according to claim 47 or 48, wherein said surface has a perimeter, said probe tip is positioned with respect to said surface so that a perpendicular line from said probe tip intersects said surface within said perimeter.

74. A method according to claim 49 or 50, wherein said surface has a perimeter, said probe tip is positioned with respect to said surface so that a perpendicular line from said probe tip intersects said surface within said perimeter.

75. A method according to claim 51 or 52, wherein said surface has a perimeter, said probe tip is positioned with respect to said surface so that a perpendicular line from said probe tip intersects said surface within said perimeter.

76. A method according to claim 53 or 54, wherein said surface has a perimeter, said probe tip is positioned with respect to said surface so that a perpendicular line from said probe tip intersects said surface within said perimeter.

77. A method according to claim 55 or 56, wherein said surface has a perimeter, said probe tip is positioned with respect to said surface so that a perpendicular line from said probe tip intersects said surface within said perimeter.

78. A method according to claim 55 or 58, wherein said surface has a perimeter, said probe tip is positioned with respect to said surface so that a perpendicular line from said probe tip intersects said surface within said perimeter.

79. A method according to claim 59 or 60, wherein said surface has a perimeter, said terminal end is positioned with respect to said surface so that a perpendicular line from said terminal end intersects said surface within said perimeter.

80. A method according to claim 61 or 62, wherein said surface has a perimeter, said terminal end is positioned with respect to said surface so that a perpendicular line from said terminal end intersects said surface within said perimeter.

* * * * *

UNITED STATES PATENT AND TRADEMARK OFFICE
CERTIFICATE OF CORRECTION

PATENT NO. : 6,334,247 B1  Page 1 of 1
APPLICATION NO. : 08/872519
DATED : January 1, 2002
INVENTOR(S) : Beaman et al.

It is certified that error appears in the above-identified patent and that said Letters Patent is hereby corrected as shown below:

On the title page item (62), Related U.S. Application Data, add before the period:

--U.S. Patent No. 5,821,763, which is a continuation of Serial No. 55,485, filed on April 30, 1993, Patent No. 5,635,846, which is a continuation-in-part of Application No. 963,346, filed on October 19, 1992, Patent No. 5,371,654.--

In Column 1, line 6 before the period add, --,U.S. Patent No. 5,821,763, which is a continuation of Serial No. 55,485, filed on April 30, 1993, Patent No. 5,635,846, which is a continuation-in-part of Application No. 963,346, filed on October 19, 1992, Patent No. 5,371,654.--

Signed and Sealed this

Third Day of April, 2007

JON W. DUDAS
*Director of the United States Patent and Trademark Office*